(12) United States Patent
Zhao et al.

(10) Patent No.: US 11,206,034 B1
(45) Date of Patent: Dec. 21, 2021

(54) ANALOG-BASED PULSE-WIDTH MODULATION RECEIVER

(71) Applicant: Marvell Asia Pte, Ltd., Singapore (SG)

(72) Inventors: Hui Zhao, San Jose, CA (US);
Zhendong Guo, San Jose, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/949,590

(22) Filed: Nov. 5, 2020

Related U.S. Application Data

(60) Provisional application No. 63/014,621, filed on Apr. 23, 2020.

(51) Int. Cl.
*H03M 1/10* (2006.01)
*H03F 3/45* (2006.01)

(52) U.S. Cl.
CPC ....... *H03M 1/1009* (2013.01); *H03F 3/45264* (2013.01)

(58) Field of Classification Search
CPC ........ H03M 1/1009; H03M 1/12; H03M 1/10; H03M 1/1071; H03M 2201/63; H03F 3/45264
USPC ................................................ 341/155, 120
See application file for complete search history.

(56) References Cited

U.S. PATENT DOCUMENTS

| | | | | |
|---|---|---|---|---|
| 6,911,809 B2* | 6/2005 | Kernahan | ............... | H03M 5/08 323/283 |
| 6,965,220 B2* | 11/2005 | Kernahan | ........... | H02M 1/0845 323/283 |
| 7,092,265 B2* | 8/2006 | Kernahan | ............... | G05F 3/262 363/65 |
| 7,157,889 B2* | 1/2007 | Kernahan | .......... | H05B 41/2828 323/268 |
| 2004/0095114 A1* | 5/2004 | Kernahan | ........... | H02M 1/0845 323/282 |
| 2004/0095264 A1* | 5/2004 | Thomas | ............... | H02M 3/1582 341/53 |

* cited by examiner

*Primary Examiner* — Jean B Jeanglaude

(57) ABSTRACT

Receiver circuitry to convert a pulse-width-modulated (PWM) signal into a digital data signal includes analog-to-digital converter circuitry that converts the PWM signal into an intermediate signal, a timing generator that derives control signals from the intermediate signal, analog charge storage circuitry that is charged and discharged according to the control signals, and circuitry that derives a digital output signal from an analog waveform output by the charge storage circuitry. The charge storage circuitry includes a capacitance and a current-limiting element, one of which is variable to control a time constant of the charge storage circuitry for calibration to a data rate of the PWM signal. A control signal may be single-ended and compared to a threshold, or may be differential with the legs compared to each other. The output is derived on a falling clock edge, and maintained until a subsequent falling clock edge.

23 Claims, 12 Drawing Sheets

ANALOG-BASED PULSE-WIDTH MODULATION RECEIVER

CROSS REFERENCE TO RELATED APPLICATION

This disclosure claims the benefit of commonly-assigned U.S. Provisional Patent Application No. 63/014,621, filed Apr. 23, 2020, which is hereby incorporated by reference herein in its entirety.

FIELD OF USE

This disclosure relates to an analog-based pulse-width modulation receiver. More particularly, this disclosure relates to an analog-based pulse-width modulation receiver that can be calibrated for multiple frequency ranges.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

The M-PHY specification, promulgated by the PHY Working Group of the MIPI (Mobile Industry Processor Interface) Alliance, Inc., describes a physical layer protocol particularly suited to mobile devices. The M-PHY specification provides for different data rate ranges, referred to as "gears," and specifies, for the lower-speed gears, that pulse-width modulation (PWM) signaling be used. Typically, devices that operate under the M-PHY specification use clock-data recovery (CDR) techniques or digital oversampling to convert a PWM signal to a digital signal such as a non-return-to-zero (NRZ) signal.

SUMMARY

In accordance with implementations of the subject matter of this disclosure, receiver circuitry to convert a pulse-width-modulated signal into a digital data signal includes analog-to-digital converter circuitry configured to convert the pulse-width-modulated signal into an intermediate digital signal, timing generator circuitry configured to derive control signals from the intermediate digital signal, analog charge storage circuitry configured to be charged and discharged according to the control signals, and circuitry configured to derive a digital output signal from an analog discharge waveform output by the analog charge storage circuitry.

In a first implementation of such receiver circuitry, the analog-to-digital converter circuitry may include an amplifier that produces a rail-to-rail output based on the pulse-width-modulated signal.

In a first instance of the first implementation of such receiver circuitry, the circuitry configured to derive a digital output signal from the analog discharge waveform may include a comparator configured to compare the analog discharge waveform to another signal.

In a first variant of that first instance of the first implementation of such receiver circuitry, the control signals may include a single-ended signal representative of the pulse-width-modulated signal, the analog discharge waveform may be controlled by the single-ended signal representative of the pulse-width-modulated signal, and the comparator configured to compare the analog discharge waveform to another signal may be configured to compare a value of the analog discharge waveform to a threshold, and to output a '1' when the value of the analog discharge waveform bears a first relationship to the threshold and to output a '0' when the value of the analog discharge waveform bears a second relationship to the threshold.

In that variant, the single-ended signal representative of the pulse-width-modulated signal may determine duration of an interval during which the analog charge storage circuitry discharges.

In a second instance of the first implementation of such receiver circuitry, the control signals may include a pair of differential signals representative of the pulse-width-modulated signal, the analog charge storage circuitry may include respective separate charge storage elements, each of the separate charge storage elements configured to be discharged under control of a respective signal in the pair of differential signals, the analog discharge waveform may include a respective separate discharge waveform for each of the respective separate charge storage elements controlled by the respective signal in the pair of differential signals, and the comparator configured to compare the analog discharge waveform to another signal may be configured to compare a value of a first respective separate discharge waveform to a value of a second respective separate discharge waveform, and to output a '1' when the value of the first respective separate discharge waveform bears a first relationship to the value of the second respective separate discharge waveform, and to output a '0' when the value of the first respective separate discharge waveform bears a second relationship to the value of the second respective separate discharge waveform.

In a second implementation of such receiver circuitry, the circuitry configured to derive a digital output signal from an analog discharge waveform output by the analog charge storage circuitry may be configured to derive the digital output signal on a falling clock edge, and the digital output signal derived on the falling clock edge may be maintained until a subsequent falling clock edge.

In a third implementation of such receiver circuitry, the analog charge storage circuitry may include a capacitance and a current-limiting element, at least one of which may be variable to control a time constant of the analog charge storage circuitry for calibration to a data rate of the pulse-width-modulated signal.

In a first instance of the third implementation of such receiver circuitry, the capacitance may be variable.

In a second instance of the third implementation of such receiver circuitry, the current-limiting element may include a variable resistance.

In a third instance of the third implementation of such receiver circuitry, the control signals may include a pair of differential signals representative of the pulse-width-modulated signal, and the analog charge storage circuitry may include respective separate pairs of the capacitance and the current-limiting element, at least one of the capacitance and the current-limiting element in each respective separate pair being variable to control a time constant of the respective separate pair for calibration to a data rate of the pulse-width-modulated signal.

A method according to implementations of the subject matter of this disclosure, for converting a pulse-width-modulated signal into a digital data signal, includes converting the pulse-width-modulated signal into an intermediate digital signal, deriving control signals from the intermediate digital signal, charging and discharging analog charge storage circuitry according to the control signals, and deriving a digital output signal from an analog discharge waveform output resulting from the discharging.

In a first implementation of such a method, converting the pulse-width-modulated signal into an intermediate digital signal may include amplifying the pulse-width-modulated signal to a rail-to-rail voltage signal.

In a second implementation of such a method, deriving the digital output signal from the analog discharge waveform may include comparing the analog discharge waveform to another signal.

In a first instance of the second implementation of such a method, deriving control signals from the intermediate digital signal may include deriving a single-ended signal representative of the pulse-width-modulated signal, the charging and discharging may be controlled by the single-ended signal representative of the pulse-width-modulated signal, and comparing the analog discharge waveform to another signal may include comparing a value of the analog discharge waveform to a threshold, and outputting a '1' when the value of the analog discharge waveform bears a first relationship to the threshold and outputting a '0' when the value of the analog discharge waveform bears a second relationship to the threshold.

A variant of that first instance of the second implementation of such a method may include determining, from the single-ended signal representative of the pulse-width-modulated signal, a duration of an interval during which the analog charge storage circuitry discharges.

In a second instance of the second implementation of such a method, deriving control signals from the intermediate digital signal may include deriving a pair of differential signals representative of the pulse-width-modulated signal, the charging and discharging may include controlling respective separate charge storage elements, including controlling discharge of each of the separate charge storage elements according to a respective signal in the pair of differential signals, and comparing the analog discharge waveform to another signal may include comparing a value of a first respective separate discharge waveform to a value of a second respective separate discharge waveform, and outputting a '1' when the value of the first respective separate discharge waveform bears a first relationship to the value of the second respective separate discharge waveform, and outputting a '0' when the value of the first respective separate discharge waveform bears a second relationship to the value of the second respective separate discharge waveform.

In a third implementation of such a method, deriving a digital output signal from the analog discharge waveform output by the analog charge storage circuitry may include deriving the digital output signal on a falling clock edge and maintaining the digital output signal derived on the falling clock edge until a subsequent falling clock edge.

A fourth implementation of such a method may further include calibrating the analog charge storage circuitry to a data rate of the pulse-width-modulated signal.

In a first instance of the fourth implementation of such a method, the calibrating may include, for each data range to be calibrated, generating a calibration pattern representing a first binary input value, varying at least one of a capacitance and a current-limiting element to provide different combinations of the capacitance and the current-limiting element to vary a time constant of the analog charge storage circuitry while the calibration pattern represents the first binary input value, and for each respective one of the different combinations, while the calibration pattern represents the first binary input value, for each respective combination of the capacitance and the current-limiting element varying a reference voltage for a first differential input and recording a respective first reference value when the digital output signal changes from a first binary output value to a second binary output value, varying a reference voltage for a second differential input and recording a respective second reference value when the digital output signal changes from the second binary output value to the first binary output value, and recording a respective first difference between the respective first reference value and the respective second reference value for the respective one of the different combinations. A maximum one of the respective first difference between the respective first reference value and the respective second reference value over all of the different combinations may be recorded. A calibration pattern representing a second binary input value may be generated, at least one of a capacitance and a current-limiting element may be varied to provide different combinations of the capacitance and the current-limiting element to vary a time constant of the analog charge storage circuitry while the calibration pattern represents the second binary input value, and for each respective one of the different combinations, while the calibration pattern represents the second binary input value, for each respective combination of the capacitance and the current-limiting element, a reference voltage for a first differential input may be varied and a respective first reference value may be recorded when the digital output signal changes from a first binary output value to a second binary output value, a reference voltage may be varied for a second differential input and a respective second reference value may be recorded when the digital output signal changes from the second binary output value to the first binary output value, and a respective second difference, between the respective first reference value and the respective second reference value for the respective one of the different combinations, may be recorded. A maximum one of the respective second difference between the respective first reference value and the respective second reference value over all of the different combinations may be recorded, and the combination of the capacitance and the current-limiting element for the data range may be calibrated to an average of the capacitance and the current-limiting element corresponding to the maximum one of the respective first difference and the maximum one of the respective second difference.

In a first variant of that first instance, varying at least one of the capacitance and the current-limiting element may include varying the capacitance.

In a second variant of that first instance, varying at least one of the capacitance and the current-limiting element may include varying a variable resistance.

In a third variant of that first instance, varying at least one of the capacitance and the current-limiting element may include varying a variable capacitance and a variable resistance.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
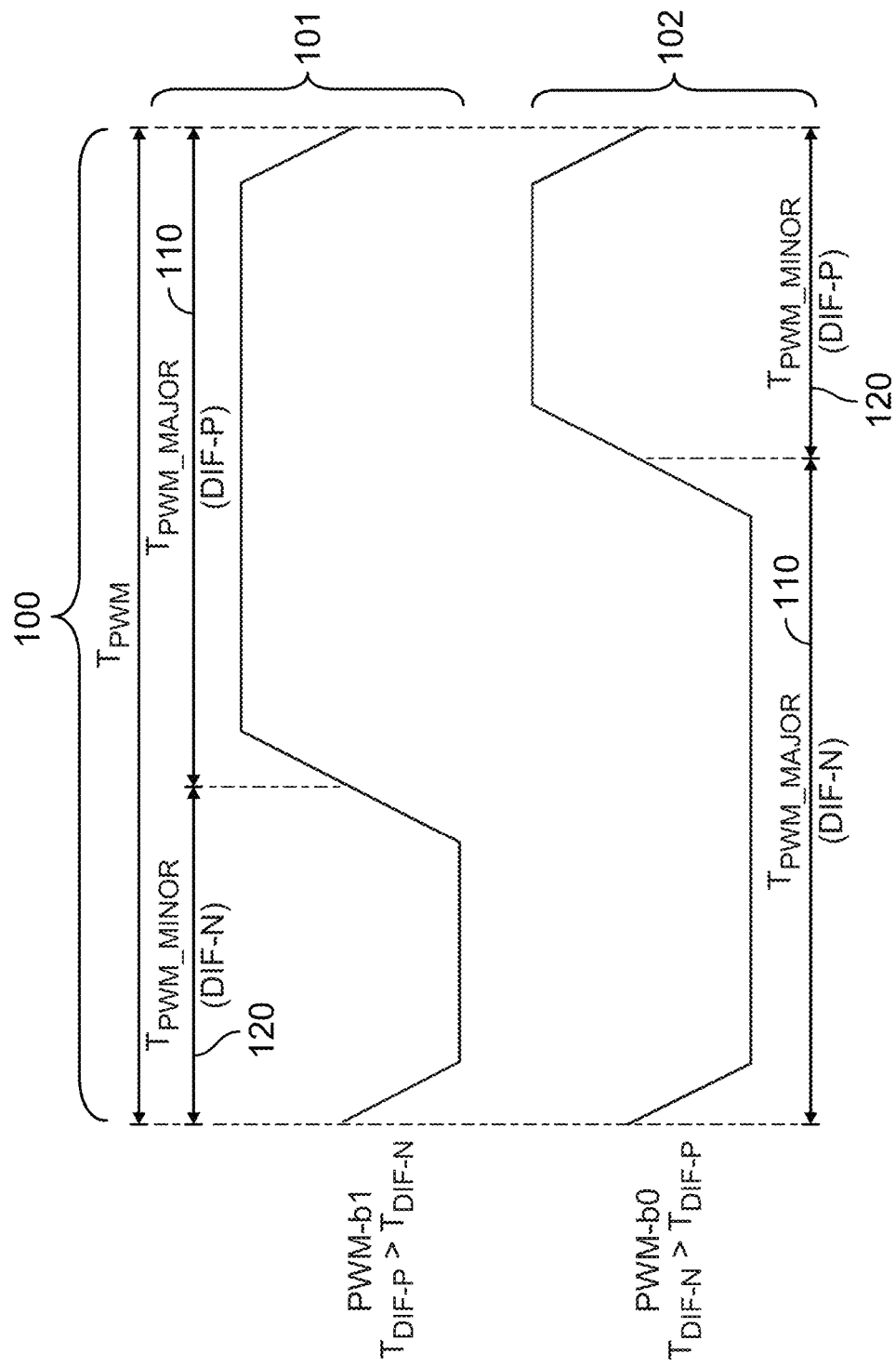
FIG. 1 shows how digital data may be represented using pulse-width modulation.

PWM-based signaling inherently includes a clock signal. Therefore, using CDR or digital oversampling techniques, which recover the clock in addition to the data from the PWM signal, is unnecessary, particularly in view of the costs in both monetary expense and device area. Moreover, known digital techniques for recovering data from a PWM signal in an M-PHY-compliant device may not support the full speed range of each gear and may need to be tuned to a particular intended subrange of a gear. However, according to implementations of the subject matter of this disclosure, an analog-based technique for recovering PWM data is not only less costly in terms of both monetary expense and device area, but also can operate, in many implementations, over the full speed range of each gear.

In accordance with implementations of the subject matter of this disclosure, a pulse-width-modulated input analog signal is first amplified to provide a full rail-to-rail digital or square-wave-like signal. As described in more detail below, a timing generator derives a sequence of signals from the rising and falling edges of the square-wave-like signal. A full clock period of the square-wave-like signal includes a high portion and a low portion. In one implementation, the binary bit value of the signal in each clock period is determined by charging a capacitor bank at the beginning of the clock period, and measuring the remaining charge at the end of the clock period. The bit value is output on that falling edge and remains in effect for the full clock period until the next falling edge, while the next bit value—which will be effective for the following clock period—is being determined.

Specifically, in implementations of the subject matter of this disclosure, the signal is measured between falling edges. Immediately after a falling edge, the capacitor bank is allowed to charge up during a short interval, and then allowed to discharge through a circuit having a time constant that is tuned as described below. On the next falling edge, the charge on the capacitor bank (as indicated by, e.g., the analog voltage) is measured to determine the output bit value that will be in effect from that falling edge until the falling edge that follows.

In one implementation, differential signaling is used, and separate capacitor banks are used for each leg of the differential signal. The value of the signal output at the falling edge is determined by comparing the analog voltages of the two legs. If, at the falling edge, the analog capacitor voltage on the positive leg is higher than the analog capacitor voltage on the negative leg, then the signal is deemed to be a '1'. If, at the falling edge, the analog capacitor voltage on the positive leg is lower than the analog capacitor voltage on the negative leg, then the signal is deemed to be a '0'.

In another implementation, single-ended signaling may be used, in which case the capacitor voltage is compared to a single threshold. During calibration, if the signal is a '1', an upper threshold is set below an upper reference voltage, while if the signal is a '0', a lower threshold is set above a lower reference voltage. The single threshold may be set as the average of the upper reference voltage and the lower reference voltage.

The receiver may be tuned according to the particular data rate (i.e., which of the M-PHY gears is in operation). Specifically, the clock period of the signal being measured will be longer at lower data rates and shorter at higher data rates. If the capacitor bank is allowed to discharge too quickly, then at lower data rates, by the end of the clock period, the capacitor bank will have discharged to zero so that no reading is possible, or the capacitor bank will have discharged to a value too low for a reliable determination. On the other hand, if the capacitor bank is allowed to discharge too slowly, then at high data rates the capacitor bank may not, by the end of the clock period, discharge sufficiently from a full charge to provide a meaningful reading. Therefore, the capacitor discharge circuit may be tuned by varying the time constant of the discharge circuit depending on the data rate.

The capacitor discharge circuit includes a capacitance and a current-limiting element. The circuit may be a simple R-C circuit, where the resistance (which is the current-limiting element), the capacitance, or both, may be variable. For example, the capacitance may be a variable capacitor in the form of a switchable capacitor network ("capacitor DAC"), and the resistance may be a variable resistor in the form of a switchable resistor network ("resistor DAC"). In an alternative implementation, the resistance may be replaced as the current-limiting element with a switchable network of current sources ("current DAC"). Other types of variable capacitance, resistance or current sources, may be used. Similarly, other types of resonant circuits, with other types of current-limiting elements, also may be used, such as an L-C circuit or an R-L-C circuit, with variable capacitance and/or variable resistance.

As just one example of how the time constant of the capacitor discharge circuit may be tuned as a function of the data rate, in a resistor DAC implementation, the differential output voltage is a function of the time constant and the data rate, as follows:

$$V_{diff} = V_0 e^{\frac{-T_{PWM}}{3\tau}} - V_0 e^{\frac{-2 \times T_{PWM}}{3\tau}}$$

$$= V_0 e^{\frac{-T_{PWM}}{3\tau}} \left(1 - e^{\frac{-T_{PWM}}{3\tau}}\right)$$

where $\tau$ is the time constant, $T_{PWM}$ is the symbol period (which is reflective of the data rate, and $V_0$ is the initial reset voltage.

As $\tau \to 0$, $$e^{\frac{-T_{PWM}}{3\tau}} \to 0,$$

and therefore $V_{diff}=0$ in the case when $\tau \to 0$. If $\tau \to +\infty$, $$\left(1 - e^{\frac{-T_{PWM}}{3\tau}}\right) \to 0,$$

and therefore $V_{diff}=0$ in the case when $\tau \to +\infty$ as well. Therefore, the value of $V_{diff}$ is maximized when $\tau$ has a value, somewhere between 0 and $+\infty$, that is a function of the time constant and the data rate. At a particular data rate, the maximum value of $V_{diff}$ can be found by sweeping the time constant (by sweeping at least one parameter that determines the time constant, such as the resistance and/or capacitance of an R-C circuit). The circuit may then be set to the time constant that results in that maximum value.

The subject matter of this disclosure may be better understood by reference to FIGS. 1-12.

FIG. 1 shows, by way of background, how digital data may be represented using pulse-width modulation. Upper waveform 101 shows how a binary '1' (b1) may be represented, while lower waveform 102 shows how a binary '0' (b0) may be represented. The total pulse-width-modulation period $T_{PWM}$ 100 may be divided into a major portion $T_{PWM-MAJOR}$ 110 and a minor portion $T_{PWM-MINOR}$ 120. When the PWM signal is high for the major portion $T_{PWM-MAJOR}$ 110 of the total period $T_{PWM}$ 100, and low for the minor portion $T_{PWM-MINOR}$ 120 of the total period $T_{PWM}$ 100, the signal is a binary '1' (b1). When the PWM signal is low for the major portion $T_{PWM-MAJOR}$ 110 of the total period $T_{PWM}$ 100, and high for the minor portion $T_{PWM-MINOR}$ 120 of the total period $T_{PWM}$ 100, the signal is a binary '0' (b0). In the illustration shown, $T_{PWM-MAJOR}$ 110 is twice as long as $T_{PWM-MINOR}$ 120—i.e., $T_{PWM-MAJOR}$ 110 is two-thirds of $T_{PWM}$ 100 and $T_{PWM-MINOR}$ 120 is one-third of $T_{PWM}$ 100. However, other duty-cycle breakdowns may be used. For example, $T_{PWM-MAJOR}$ could be three-quarters (75%) of $T_{PWM}$ 100 while $T_{PWM-MINOR}$ could be one-quarter (25%) of $T_{PWM}$ 100.

Figure 2:
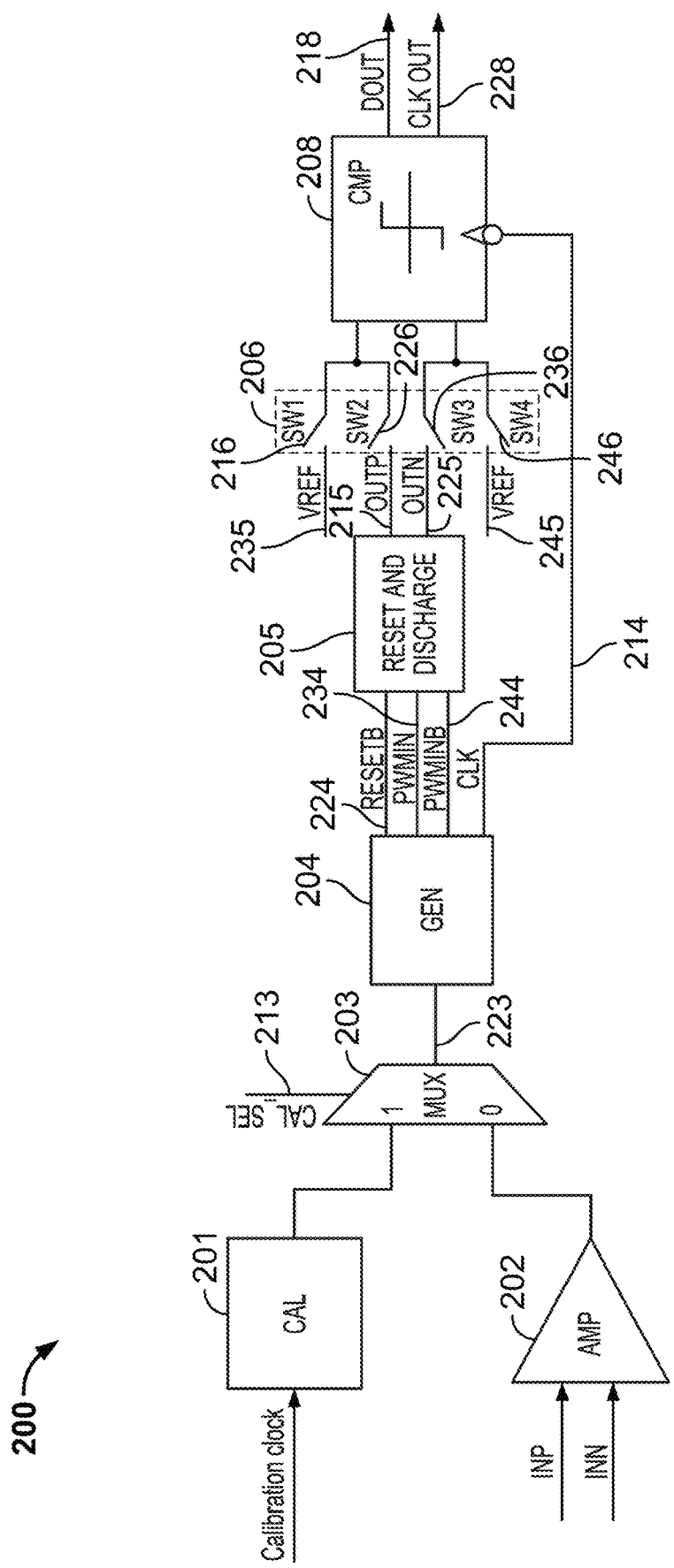
FIG. 2 is a schematic diagram of an implementation of a PWM receiver according to the subject matter of this disclosure.
Figure 3:
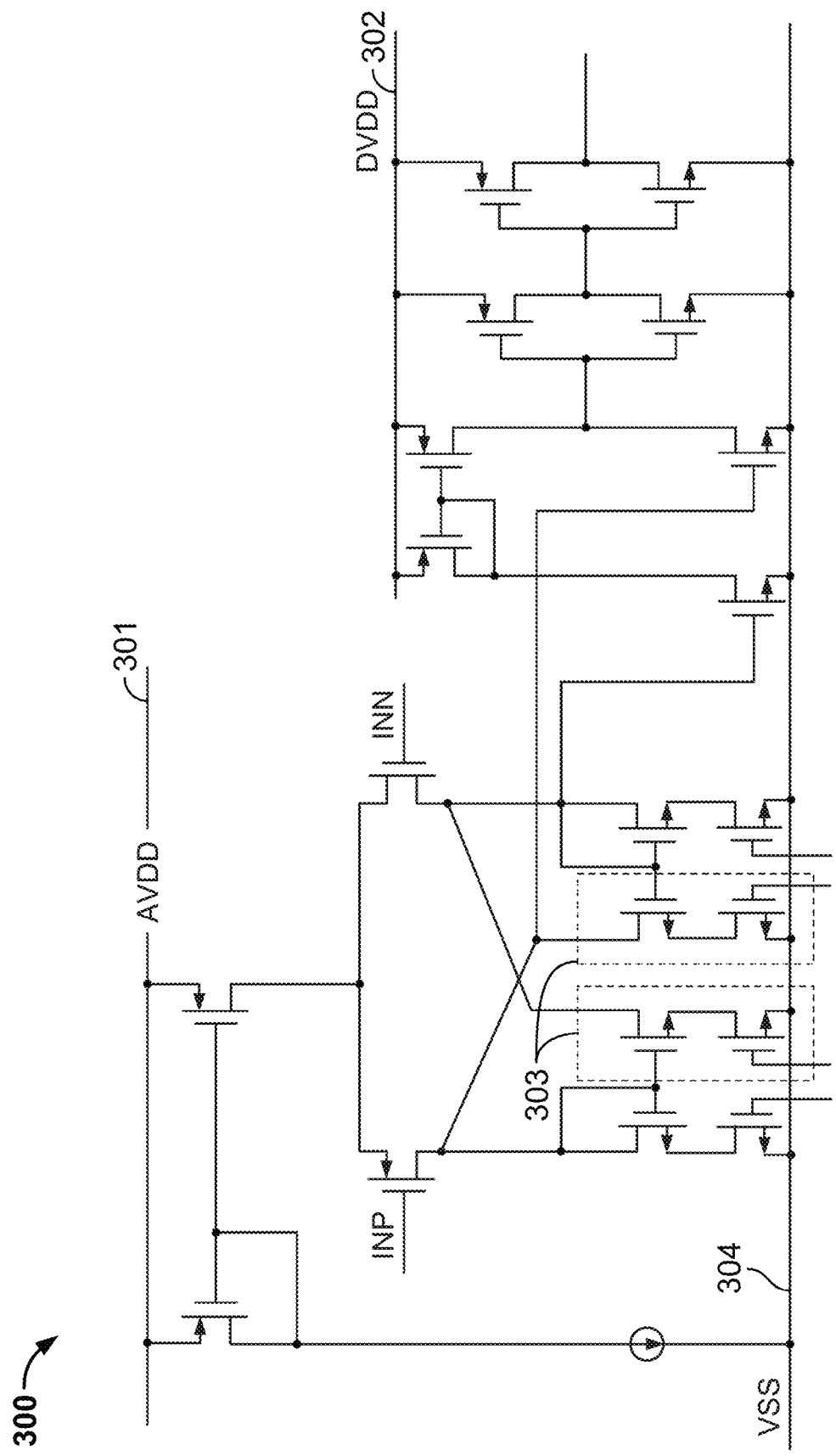
FIG. 3 is a schematic diagram of an implementation of an amplifier that may be used in implementations of the subject matter of this disclosure.

One implementation of a PWM receiver 200 according to the subject matter of this disclosure is shown in FIG. 2. Multiplexer (MUX) 203, under control of calibration selection (CAL_SEL) signal 213 selects either the output of calibration circuitry 201 (in calibration mode) (FIG. 8) or the output of amplifier 202 (in operation mode) (FIG. 3). The output 223 of MUX 203 is input to timing generator 204 (FIGS. 4, 4A) which, as described in more detail below, derives clock signal 214 and reset signal 224, as well as PWM duty cycle signals 234, 244 (which may represent actual data in operation mode, or calibration data in calibration mode), from MUX output 223.

The PWM duty cycle signals are used to charge and discharge the capacitor banks 602 (FIG. 6) of reset-and-discharge circuitry 205, under control of clock signal 214 and reset signal 224. Switches SW1 (216), SW2 (226), SW3 (236) and SW4 (246) of switch bank 206 couple positive output 215 and negative output 225 of reset-and-discharge circuitry 205 to clock-triggered comparator 208 (FIG. 6), which compares positive output 215 and negative output 225 on falling edges of clock signal 214, and provides output data signal (DOUT) 218 and also passes through the clock signal 214 as output 228 (CLK_OUT).

One implementation 300 of amplifier 202, which may be conventional, is shown in FIG. 3, and includes some programmability 303 of gain and hysteresis. Amplifier 202 functions as a form of analog-to-digital converter, converting the analog PWM signal to the digital domain by forcing the signal, which ranges between analog high voltage AVDD 301 and ground (VSS) 304, to either the high rail voltage DVDD 302 or the low rail voltage (which again is ground VSS 304).

Figure 4:
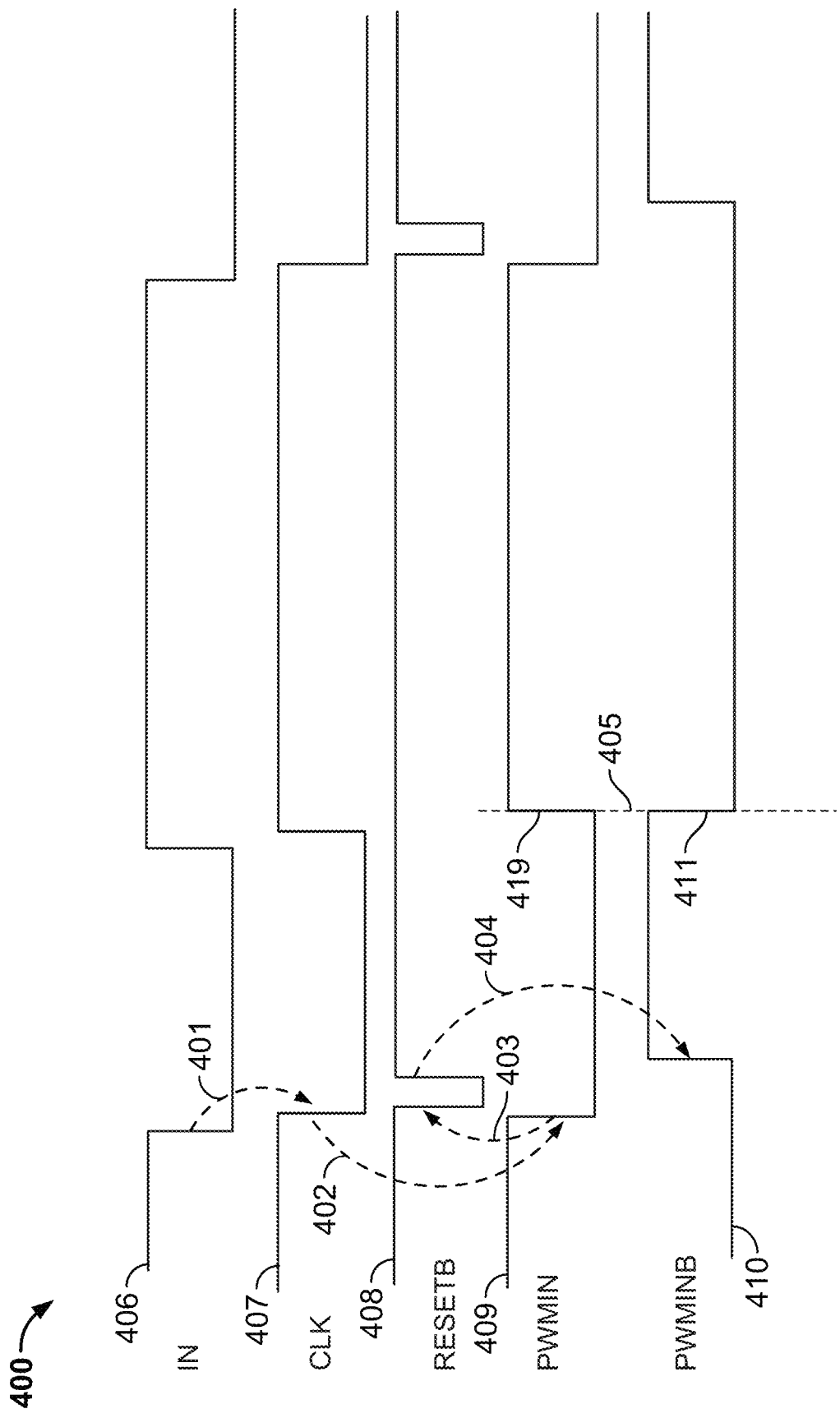
FIG. 4 shows a timing pattern that may be used in implementations of the subject matter of this disclosure.
Figure 5:
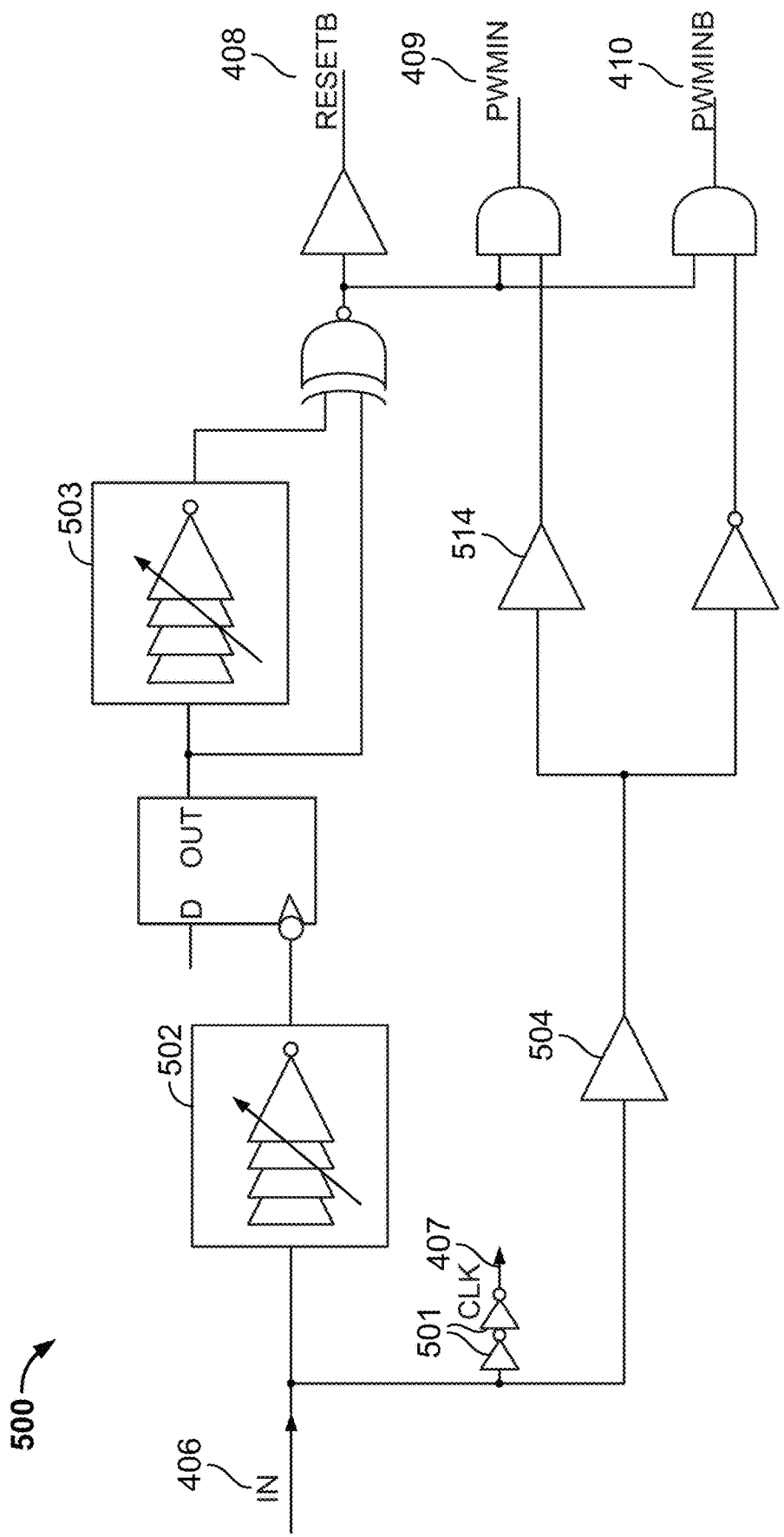
FIG. 5 is a schematic diagram of a circuit implementation of a timing generator that generates the timing pattern of FIG. 4.

An implementation of the timing patterns 400 provided by timing generator 204 for clock signal 214 and reset signal 224, as well as PWM duty cycle signals 234, 244, is shown in FIG. 4. According to this implementation of timing pattern 400, clock signal 407 (equivalent to clock signal 214) is a slightly delayed version of input signal 406 (equivalent to signal 223). As seen in FIG. 5, which shows a circuit implementation 500 of timing generator 204, the delay between input 406 and clock signal 407 may be provided by inverters 501.

RESETB signal 408 (equivalent to reset signal 224) is a negative-going pulse which is delayed from the falling edge of clock signal 407 by a controllable amount based on an adjustment of variable delay 502. The pulse width of RESETB signal 408 also is controllable based on an adjustment of variable delay 503.

PWMIN signal 409, from which reset-and-discharge circuitry 205 derives the negative leg OUTN of the differential output signal, is delayed, similarly to clock signal 407, by two delays 504, 514, and therefore coincides with the falling edge of clock signal 407. PWMINB signal 410, from which reset-and-discharge circuitry 205 derives the positive leg OUTB of the differential output signal, follows the rising edge of RESETB signal 408. However, intermediate edges 419, 411 of PWMIN signal 409 and PWMINB signal 410, may occur simultaneously at 405.

Figure 6:
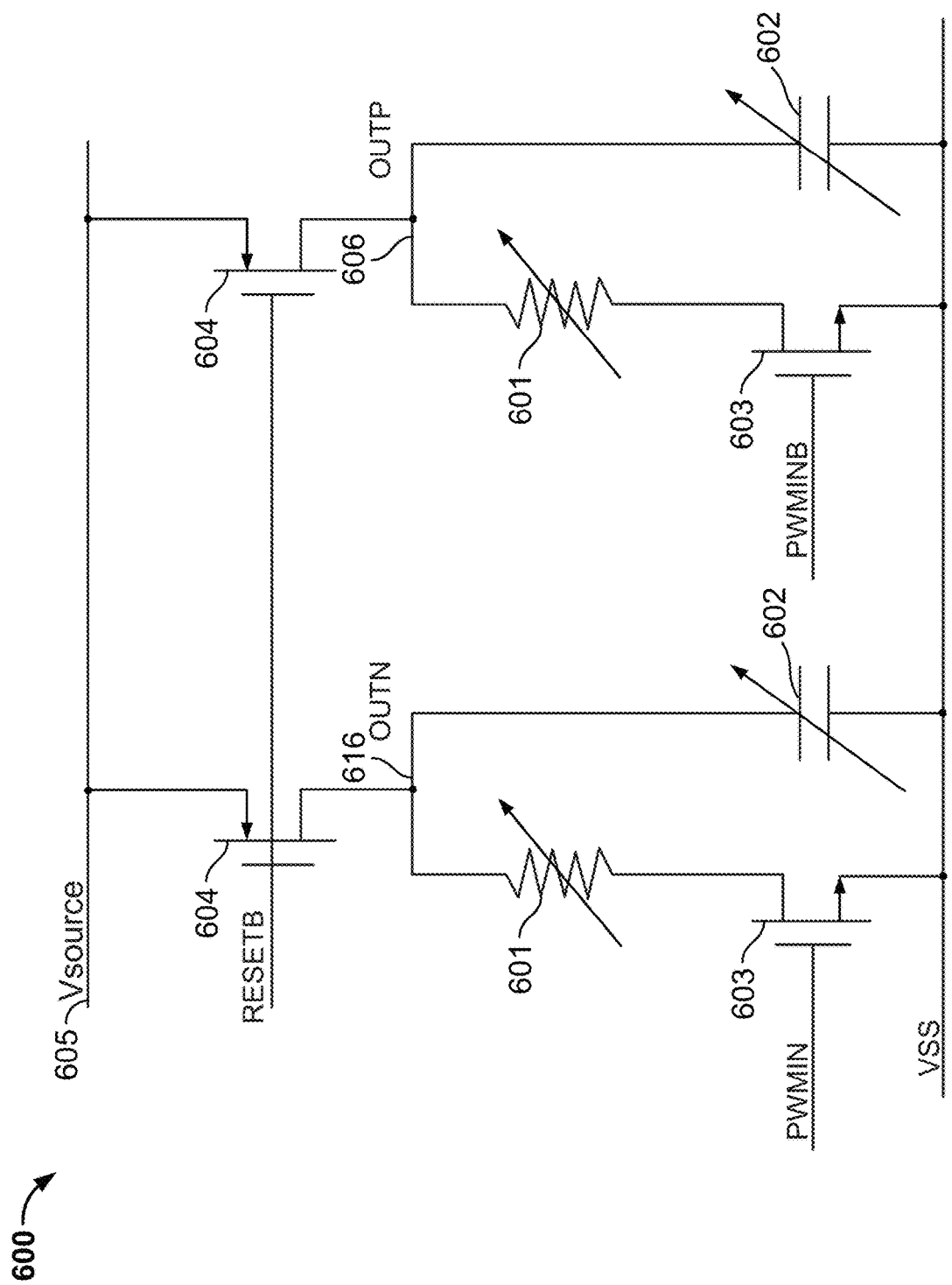
FIG. 6 is a schematic diagram of an implementation of reset-and-discharge circuitry that may be used in implementations of the subject matter of this disclosure.
Figure 7:
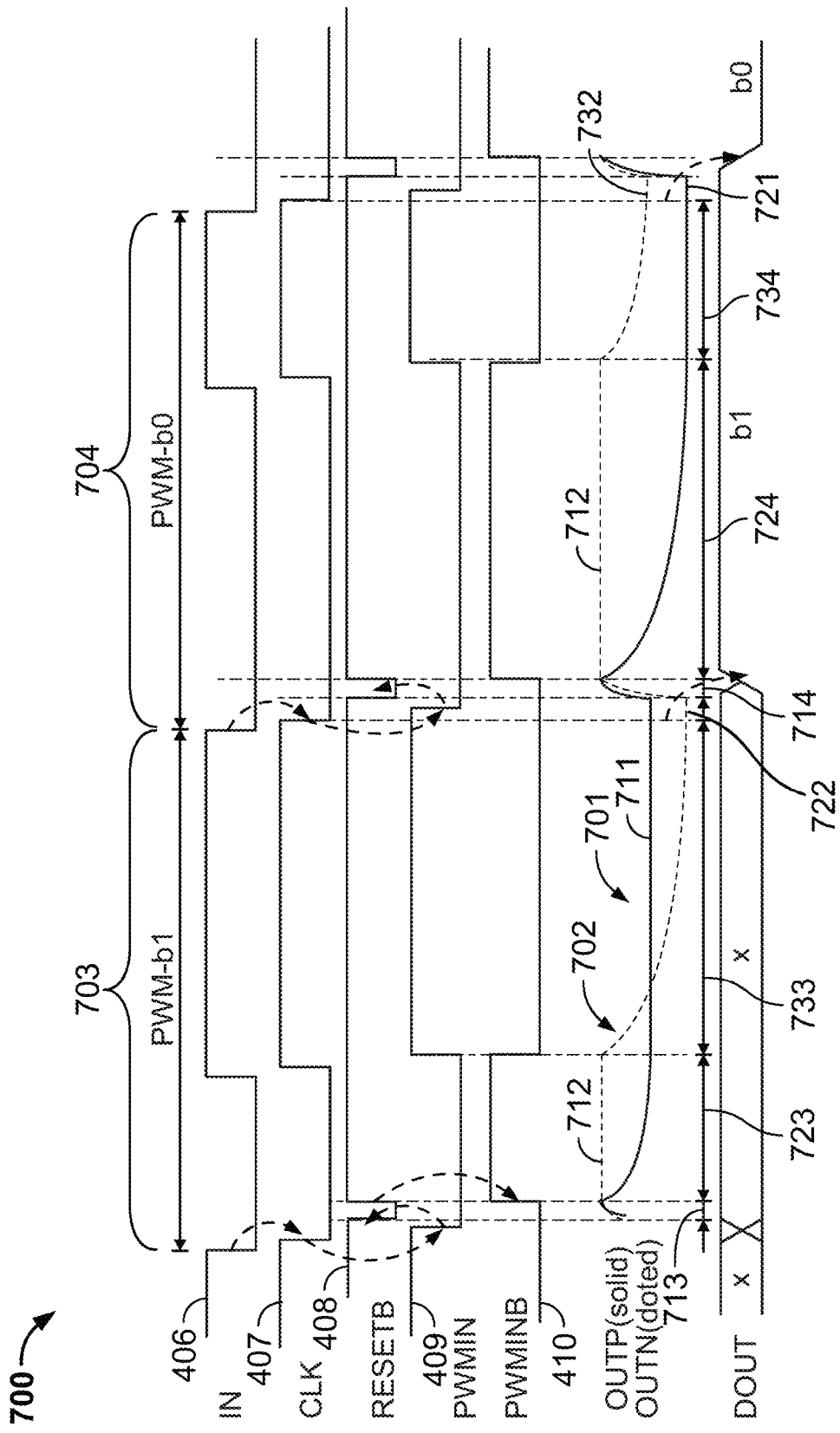
FIG. 7 is a plot of input and output waveforms of the circuitry of FIG. 6.

FIG. 6 shows an implementation 600 of reset-and-discharge circuitry 205. In this implementation, positive output signal (OUTP) 215 is provided by programmable R-C circuit 606, while negative output signal (OUTN) 225 is provided by programmable R-C circuit 616. The pulse of RESETB signal 408 resets each R-C circuit 606, 616 by coupling each R-C circuit 606, 616 to voltage source $V_{source}$ 605, so that respective variable capacitors 602 recharge. PWMINB signal 410 and PWMIN signal 409 respectively activate respective transistors 603 of respective programmable R-C circuits 606, 616 to discharge respective variable capacitors 602 to ground voltage VSS. With the time constant of each programmable R-C circuit 606, 616 properly calibrated to the data rate of the gear that is in use, the resulting outputs are shown in FIG. 7. Calibration may be accomplished by adjusting variable capacitors 602 as well as variable resistors (resistor DACs) 601. Each resistor DACs 601 operates as programmable current flow limiter, and may alternatively be replaced by variable current sources or variable current sinks (not shown) ("current DACs"). The discharge DACs could be binary, uniform, or non-linear.

The capacitor discharge waveform patterns 701, 702 are shown in plot 700 of FIG. 7. OUTP pattern 701, represented by a solid line, is the discharge pattern of capacitor 602 in OUTP RC circuit 606, while OUTN pattern 702, represented by a dashed line, is the discharge pattern of capacitor 602 in OUTN R-C circuit 616.

During time interval 703, PWM input signal 406 is high for longer than it is low, representing a binary '1' (b1). During subinterval 713, while RESETB signal 408 is asserted (low), respective capacitors 602 of both R-C circuits 606, 616 are recharged. During the following subinterval 723, PWMIN signal 409 remains low, so capacitor 602 of OUTN R-C circuit 616 is not discharged and maintains a constant voltage value 712. However, PWMINB signal 410 is high, discharging capacitor 602 of OUTP R-C circuit 606 so that it decays, according to its time constant, to voltage value 711. During subinterval 733, PWMINB signal 410 goes low, so that capacitor 602 of OUTP R-C circuit 606 stops discharging and remains at voltage value 711. However, PWMIN signal 409 goes high, discharging capacitor 602 of OUTN R-C circuit 616. Because subinterval 733 is longer than subinterval 723, capacitor 602 of OUTN R-C circuit 616 decays further than capacitor 602 of OUTP R-C circuit 606 had decayed during subinterval 723, to a voltage value 722 lower than voltage value 711.

At the end of interval 703, OUTN voltage 702 is compared to OUTP voltage 701 by comparator 208. In the illustration shown, at the end of interval 703, OUTP voltage 701, at value 711, is higher than OUTN voltage 702, at value 722, and therefore the output 218 is binary '1' (b1). The transition to output b1 occurs at the end of interval 703 and is effective for the duration of interval 704, while, during interval 704, the value of PWM input signal 406 is processed to determine a possible transition of output 218 at the end of interval 704 to be effective for the following interval (not shown). Similarly, during interval 703, the state of output 218 was the state (indeterminate in FIG. 7) determined by processing PWM input signal 406 during a previous interval (not shown). If interval 703 is the first interval at startup, then the state of output 218 may be indeterminate for the duration of interval 703.

During time interval 704, PWM input signal 406 is low for longer than it is high, representing a binary '0' (b0). During subinterval 714 while RESETB signal 408 is asserted (low), respective capacitors 602 of both R-C circuits 606, 616 are recharged. During the following subinterval 724, PWMIN signal 409 remains low, so capacitor 602 of OUTN R-C circuit 616 is not discharged and maintains a constant voltage value 712. However, PWMINB signal 410 is high, discharging capacitor 602 of OUTP R-C circuit 606 so that it decays, according to its time constant, to voltage value 721. During subinterval 734, PWMINB signal 410 goes low, so that capacitor 602 of OUTP R-C circuit 606 stops discharging and remains at voltage value 721. However, PWMIN signal 409 goes high, discharging capacitor 602 of OUTN R-C circuit 616. Because subinterval 734 is shorter than subinterval 724, capacitor 602 of OUTN R-C circuit 616 decays less than capacitor 602 of OUTP R-C circuit 606 had decayed during subinterval 724, to a voltage value 732 higher than voltage value 721.

At the end of interval 704, voltage 702 is compared to voltage 701 by comparator 208. In the illustration shown, at the end of interval 704, OUTP voltage 701, at value 721, is lower than OUTN voltage 702, at value 732, and therefore the output 218 is binary '0' (b0). The transition to output b0 occurs at the end of interval 704 and is effective for the duration of the following interval (not shown), while, during that following interval, the value of PWM input signal 406 is processed to determine a possible transition of output 218 at the end of that following interval to be effective for the interval after the following interval (not shown).

Figure 8:
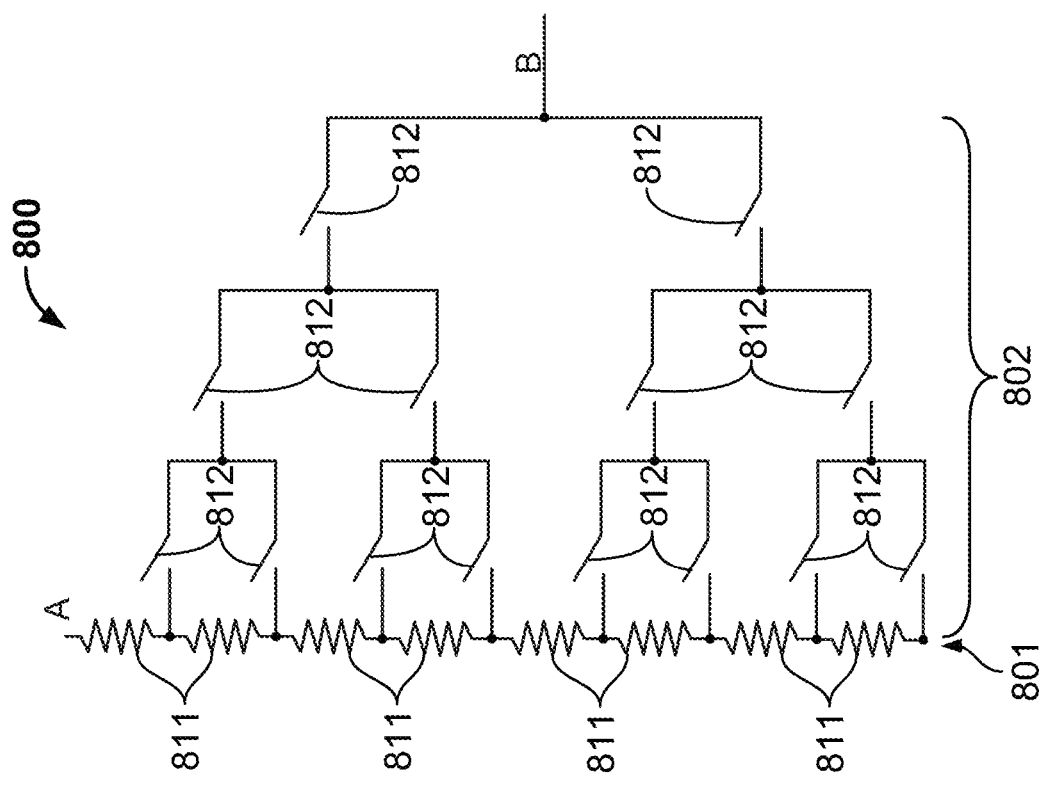
FIG. 8 is a schematic diagram of an implementation of a variable resistance that may be used in implementations of the subject matter of this disclosure.

One possible implementation 800 of resistor DAC 601 is shown in FIG. 8. Resistor DAC 800 is a ladder 801 of individual resistors 811 with node A of resistor DAC 800 at one end of ladder 801. Node B of resistor DAC 800 is connected to resistor ladder 801 by network 802 controlled by switches 812. Depending on which of switches 812 is open or closed, the total resistance of resistor DAC 800 will vary.

Figure 9:
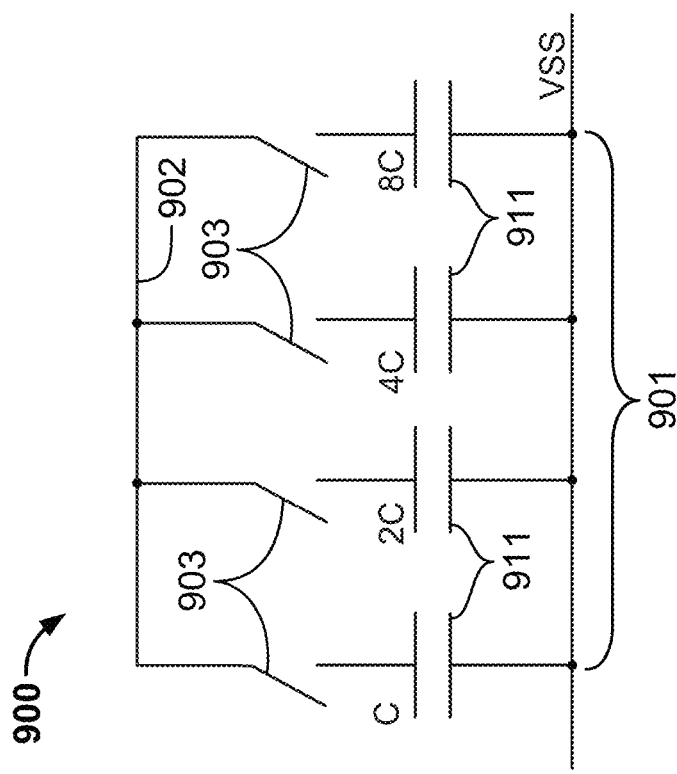
FIG. 9 is a schematic diagram of an implementation of a variable capacitance that may be used in implementations of the subject matter of this disclosure.

One possible implementation 900 of capacitor DAC 602 is shown in FIG. 9. Capacitor DAC 900 is a parallel array 901 of individual capacitors 911 between node 902 and ground voltage VSS. The individual capacitors 911 are connected to node 902 by switches 903. Depending on which of switches 903 is open or closed, the total capacitance of capacitor DAC 900 will vary. This particular arrangement of capacitors as illustrated is binary—i.e., each successive one of the parallel capacitors has a capacitance twice that of the previous capacitor—but the capacitor arrangement could also be uniform or non-linear.

Figure 10:
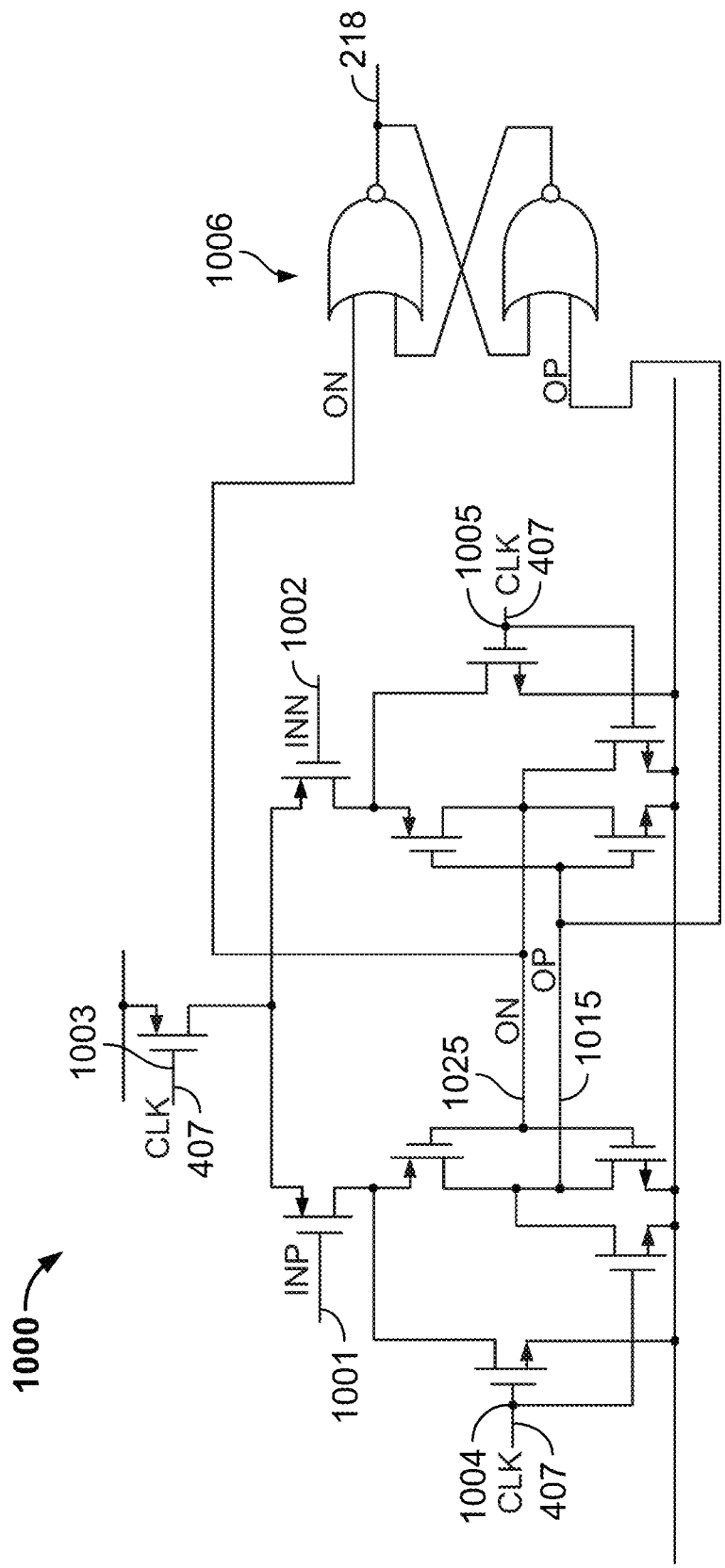
FIG. 10 is a schematic diagram of an implementation of a comparator that may be used in implementations of the subject matter of this disclosure.

During normal operation (i.e., as opposed to during calibration), switches SW1 (216) and SW4 (246) of switch bank 206 are open, while switches SW2 (226) and SW3 (236) of switch bank 206 are closed to couple positive output 215 and negative output 225, respectively, to clock-triggered comparator 208. FIG. 10 shows one implementation 1000 of a clock-triggered comparator 208. Positive output 215 and negative output 225 of reset-and-discharge circuitry 205 are coupled, respectively to positive input (INP) 1001 and negative input (INN) 1002 of this conventional arrangement of transistors. The states of positive comparator output (OP) 1015 and negative comparator output (ON) 1025 update to reflect the inputs 1001, 1002 on the falling edge of clock signal 407, which is coupled to inputs 1003, 1004, 1005. Latch 1006 outputs a '1' when positive comparator output (OP) 1015 is high and negative comparator output (ON) 1025 is low, and outputs a '0' when positive comparator output (OP) 1015 is low and negative comparator output (ON) 1025 is high (i.e., the output of latch 1006 follows positive comparator output (OP) 1015 and holds that value until the values of both positive comparator output (OP) 1015 and negative comparator output (ON) 1025 invert. The output of latch 1006 is DOUT 218.

During calibration (i.e., as opposed to during normal operation), switch bank 206 is used either to couple positive output (OUTP) 215 and a reference voltage 235, or to couple negative output (OUTN) 225 and a reference voltage 245, to clock-triggered comparator 208. Normally, reference voltage 235 and reference voltage 245 are the same. Specifically, calibration is performed using positive output (OUTP) 215 by closing switches SW2 (226) and SW4 (246), and opening switches SW1 (216) and SW3 (236), so that positive output (OUTP) 215 is being compared in comparator 208 to reference voltage 235, and calibration is performed using negative output (OUTN) 225 by closing switches SW1 (216) and SW3 (236), and opening switches SW2 (226) and SW4 (246), so that negative output (OUTN) 225 is being compared in comparator 208 to reference voltage 245.

Figure 11:
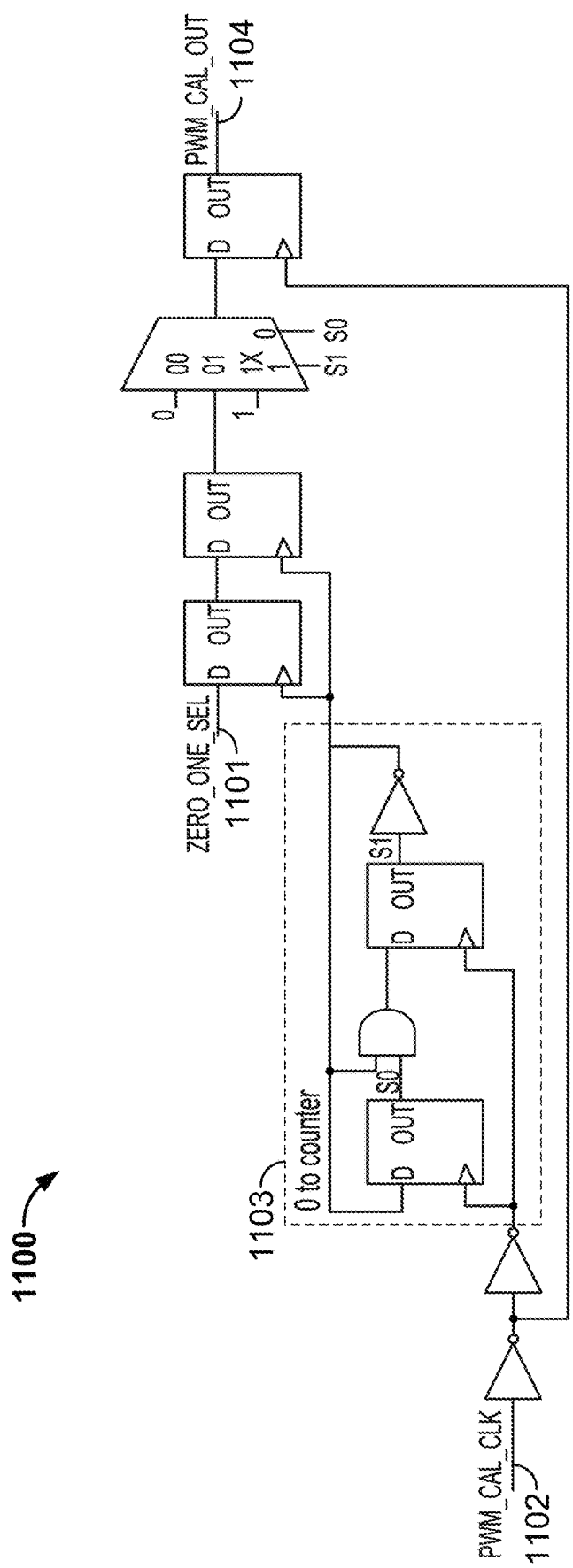
FIG. 11 is a schematic diagram of an implementation of calibration circuitry that may be used in implementations of the subject matter of this disclosure.

Calibration is performed to determine which settings of variable resistor DACs 601 and/or variable capacitor DACs 602 to use in each gear, based on a calibration clock pattern generated by calibration circuitry 201. An implementation 1100 of calibration circuitry 201 is shown in FIG. 11. ZERO_ONE_SEL input 1101 selects whether a '0' (b0) or '1' (b1) is to be output. The system clock is input at 1102. A digital or square-wave-like signal (PWM_CAL_OUT)

1104 is output. The relative fractional periods during which signal 1104 is low or high is determined by counter 1103. As shown, counter 1103 is a 0-to-2 counter which yield an output calibration signal 1104 that is low during one-third of its period and high during two-thirds of its period for a b1, and low during two-thirds of its period and high during one-third of its period for a b0.

Figure 12A:
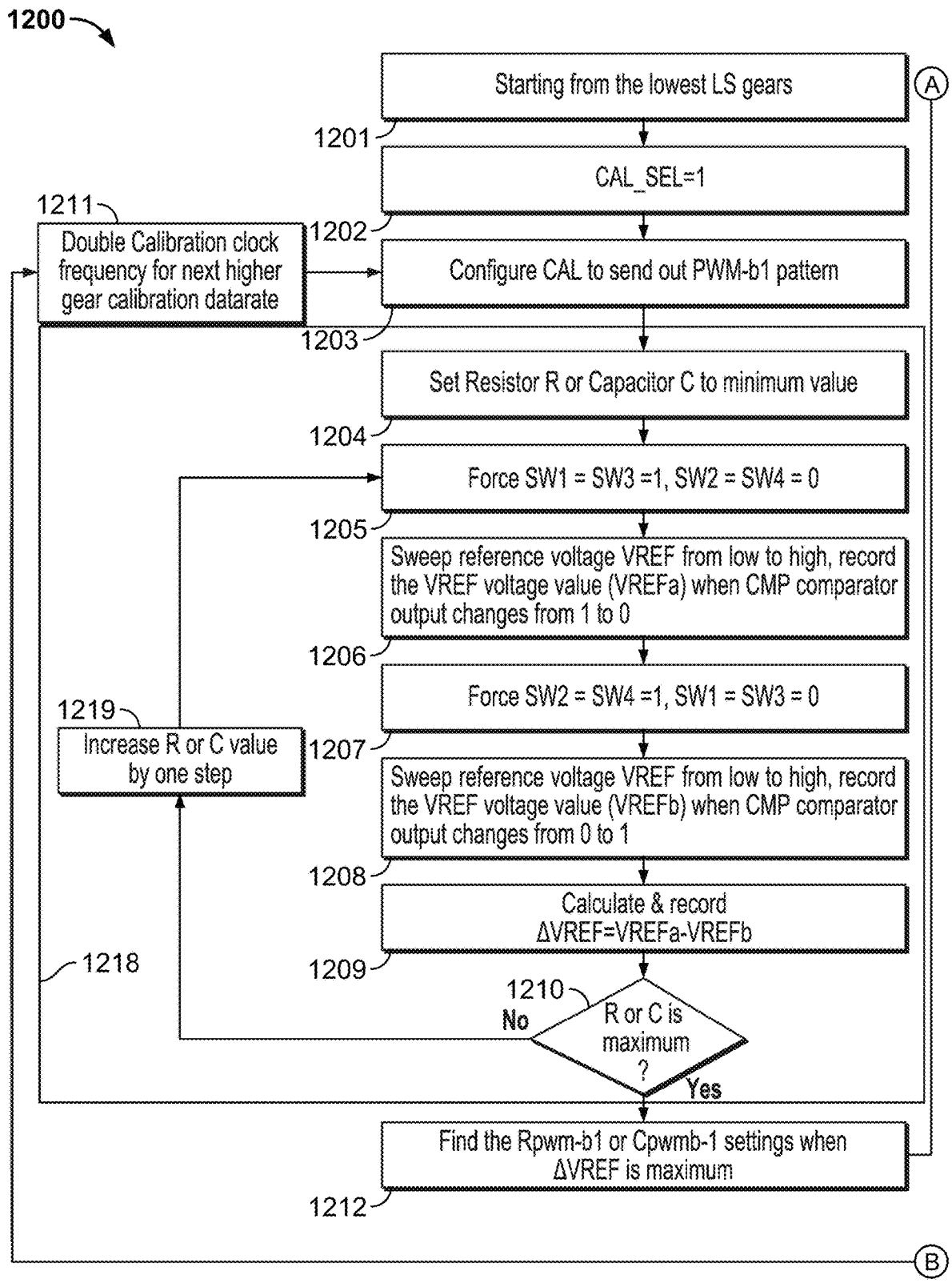
FIGS. 12A and 12B (hereinafter collectively referred to as FIG. 12) are a flow diagram showing a calibration method in accordance with implementations of the subject matter of this disclosure.
Figure 12B:
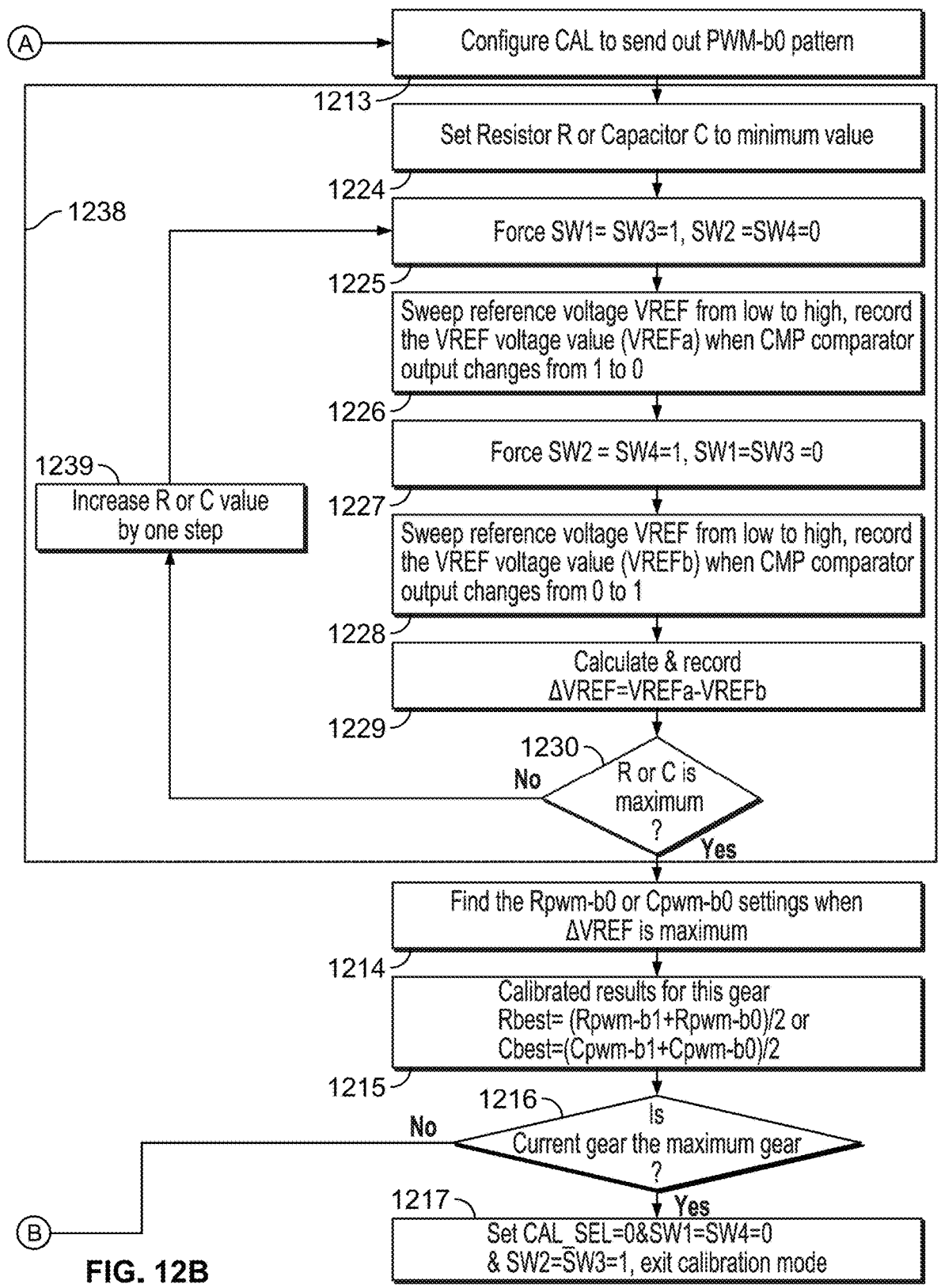

One implementation 1200 of a method of calibration is shown in FIG. 12. At 1201, calibration starts for the lowest gear. At 1202, CAL_SEL signal 213 is asserted to turn on calibration mode. At 1203, calibration circuitry 201 is configured to output its b1 pattern, and b1 calibration loop 1218 begins.

At 1204, resistor DAC 601 and/or capacitor DAC 602 in both OUTP R-C circuit 606 and OUTN R-C circuit 616 are set to their lowest values.

At 1205, switches SW1 (216) and SW3 (236) are closed and switches SW2 (226) and SW4 (246) are opened. At 1206, the value of reference voltage 235 is swept from its lowest value to its highest value, and the value VREFa at which comparator output 218 changes is recorded.

At 1207, switches SW2 (226) and SW4 (246) are closed and switches SW1 (216) and SW3 (236) are opened. At 1208, the value of reference voltage 245 is swept from its lowest value to its highest value, and the value VREFb at which comparator output 218 changes is recorded.

At 1209, the difference ΔVREF=VREFa−VREFb is recorded.

At 1210, it is determined whether resistor DAC 601 and/or capacitor DAC 602 in both OUTP R-C circuit 606 and OUTN R-C circuit 616 are set to their highest values. If so, flow continues to 1212. However, if at 1210 resistor DAC 601 and/or capacitor DAC 602 in both OUTP R-C circuit 606 and OUTN R-C circuit 616 are not set to their highest values then at 1219 resistor DAC 601 and/or capacitor DAC 602 in both OUTP R-C circuit 606 and OUTN R-C circuit 616 are set to a next higher value and loop 1218 continues at 1205. The specific combinations of values of resistor DAC 601 and/or capacitor DAC 602 may vary according to the precision desired. At one extreme, all combinations of resistor DAC 601 and/or capacitor DAC 602 may be tried; for example, resistor DAC 601 may be set to its lowest value and then all values of capacitor DAC 602 may be tried, and then resistor DAC 601 may be set to a next higher value and again all values of capacitor DAC 602 may be tried, and this may continue until all values of capacitor DAC 602 are tried for each value of resistor DAC 601. At another extreme, only either resistor DAC 601 or capacitor DAC 602 is varied, with the other one of resistor DAC 601 and capacitor DAC 602 being held at a single value. In another scheme, at each iteration, both resistor DAC 601 and capacitor DAC 602 are stepped up to their next values. Other combinations are possible. Once the maximum value of resistor DAC 601 and/or capacitor DAC 602 is reached, flow proceeds to 1212.

At 1212, all of the values of ΔVREF recorded during loop 1218 are examined and the settings of resistor DAC 601 and capacitor DAC 602 that produced the highest value of ΔVREF are recorded.

At 1213, calibration circuitry 201 is configured to output its b0 pattern, and b0 calibration loop 1238 begins.

At 1224, resistor DAC 601 and/or capacitor DAC 602 in both OUTP R-C circuit 606 and OUTN R-C circuit 616 are set to their lowest values.

At 1225, switches SW1 (216) and SW3 (236) are closed and switches SW2 (226) and SW4 (246) are opened. At 1226, the value of reference voltage 235 is swept from its lowest value to its highest value, and the value VREFa at which comparator output 218 changes is recorded.

At 1227, switches SW2 (226) and SW4 (246) are closed and switches SW1 (216) and SW3 (236) are opened. At 1228, the value of reference voltage 245 is swept from its lowest value to its highest value, and the value VREFb at which comparator output 218 changes is recorded.

At 1229, the difference ΔVREF=VREFa−VREFb is recorded.

At 1230, it is determined whether resistor DAC 601 and/or capacitor DAC 602 in both OUTP R-C circuit 606 and OUTN R-C circuit 616 are set to their highest values. If so, flow continues to 1214. However, if at 1230 resistor DAC 601 and/or capacitor DAC 602 in both OUTP R-C circuit 606 and OUTN R-C circuit 616 are not set to their highest values then at 1239 resistor DAC 601 and/or capacitor DAC 602 in both OUTP R-C circuit 606 and OUTN R-C circuit 616 are set to a next higher value and loop 1238 continues at 1225. The specific combinations of values of resistor DAC 601 and/or capacitor DAC 602 may vary according to the precision desired. At one extreme, all combinations of resistor DAC 601 and/or capacitor DAC 602 may be tried; for example, resistor DAC 601 may be set to its lowest value and then all values of capacitor DAC 602 may be tried, and then resistor DAC 601 may be set to a next higher value and again all values of capacitor DAC 602 may be tried, and this may continue until all values of capacitor DAC 602 are tried for each value of resistor DAC 601. At another extreme, only either resistor DAC 601 or capacitor DAC 602 is varied, with the other one of resistor DAC 601 and capacitor DAC 602 being held at a single value. In another scheme, at each iteration, both resistor DAC 601 and capacitor DAC 602 are stepped up to their next values. Other combinations are possible. Once the maximum value of resistor DAC 601 and/or capacitor DAC 602 is reached, flow proceeds to 1214.

At 1214, all of the values of ΔVREF recorded during loop 1238 are examined and the settings of resistor DAC 601 and capacitor DAC 602 that produced the highest value of ΔVREF are recorded. At 1215, the settings recorded at 1214 and the setting recorded at 1212 are averaged as the settings to be used for the current gear.

At 1216 it is determined whether the current gear is the highest gear. If not, flow proceeds to 1211 where the clock is increased (e.g., doubled) to the speed of the next gear and flow then returns to 1203 to calibrate that gear. If at 1216 it is determined that the current gear is the highest gear, then flow proceeds to 1217 where CAL_SEL is set to turn off calibration mode and operation mode is entered by closing switches SW2 (226) and SW3 (236), and opening switches SW1 (216) and SW4 (246), and method 1200 ends.

Thus it is seen that an analog-based pulse-width modulation receiver that can be calibrated for multiple frequency ranges, including a method of calibrating the receiver, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. Receiver circuitry to convert a pulse-width-modulated signal into a digital data signal, the receiver circuitry comprising:

analog-to-digital converter circuitry configured to convert the pulse-width-modulated signal into an intermediate digital signal;

timing generator circuitry configured to derive control signals from the intermediate digital signal;

analog charge storage circuitry configured to be charged and discharged according to the control signals; and circuitry configured to derive a digital output signal from an analog discharge waveform output by the analog charge storage circuitry.

2. The receiver circuitry of claim 1, wherein the analog-to-digital converter circuitry comprises an amplifier that produces a rail-to-rail output based on the pulse-width-modulated signal.

3. The receiver circuitry of claim 1, wherein the circuitry configured to derive a digital output signal from the analog discharge waveform comprises a comparator configured to compare the analog discharge waveform to another signal.

4. The receiver circuitry of claim 3, wherein:
the control signals comprise a single-ended signal representative of the pulse-width-modulated signal;
the analog discharge waveform is controlled by the single-ended signal representative of the pulse-width-modulated signal; and
the comparator configured to compare the analog discharge waveform to another signal is configured to compare a value of the analog discharge waveform to a threshold, and to output a '1' when the value of the analog discharge waveform bears a first relationship to the threshold and to output a '0' when the value of the analog discharge waveform bears a second relationship to the threshold.

5. The receiver circuitry of claim 4, wherein the single-ended signal representative of the pulse-width-modulated signal determines duration of an interval during which the analog charge storage circuitry discharges.

6. The receiver circuitry of claim 3, wherein:
the control signals comprise a pair of differential signals representative of the pulse-width-modulated signal;
the analog charge storage circuitry comprises respective separate charge storage elements, each of the separate charge storage elements configured to be discharged under control of a respective signal in the pair of differential signals;
the analog discharge waveform comprises a respective separate discharge waveform for each of the respective separate charge storage elements controlled by the respective signal in the pair of differential signals; and
the comparator configured to compare the analog discharge waveform to another signal is configured to compare a value of a first respective separate discharge waveform to a value of a second respective separate discharge waveform, and to output a '1' when the value of the first respective separate discharge waveform bears a first relationship to the value of the second respective separate discharge waveform, and to output a '0' when the value of the first respective separate discharge waveform bears a second relationship to the value of the second respective separate discharge waveform.

7. The receiver circuitry of claim 1, wherein:
the circuitry configured to derive a digital output signal from an analog discharge waveform output by the analog charge storage circuitry is configured to derive the digital output signal on a falling clock edge; and
the digital output signal derived on the falling clock edge is maintained until a subsequent falling clock edge.

8. The receiver circuitry of claim 1, wherein the analog charge storage circuitry comprises a capacitance and a current-limiting element, at least one of which is variable to control a time constant of the analog charge storage circuitry for calibration to a data rate of the pulse-width-modulated signal.

9. The receiver circuitry of claim 8, wherein the capacitance is variable.

10. The receiver circuitry of claim 8, wherein the current-limiting element comprises a variable resistance.

11. The receiver circuitry of claim 8, wherein:
the control signals comprise a pair of differential signals representative of the pulse-width-modulated signal; and
the analog charge storage circuitry comprises respective separate pairs of the capacitance and the current-limiting element, at least one of the capacitance and the current-limiting element in each respective separate pair being variable to control a time constant of the respective separate pair for calibration to a data rate of the pulse-width-modulated signal.

12. A method for converting a pulse-width-modulated signal into a digital data signal, the method comprising:
converting the pulse-width-modulated signal into an intermediate digital signal;
deriving control signals from the intermediate digital signal;
charging and discharging analog charge storage circuitry according to the control signals; and
deriving a digital output signal from an analog discharge waveform output resulting from the discharging.

13. The method of claim 12, wherein converting the pulse-width-modulated signal into an intermediate digital signal comprises amplifying the pulse-width-modulated signal to a rail-to-rail voltage signal.

14. The method of claim 12, wherein deriving the digital output signal from the analog discharge waveform comprises comparing the analog discharge waveform to another signal.

15. The method of claim 14, wherein:
deriving control signals from the intermediate digital signal comprises deriving a single-ended signal representative of the pulse-width-modulated signal;
the charging and discharging is controlled by the single-ended signal representative of the pulse-width-modulated signal; and
comparing the analog discharge waveform to another signal comprises comparing a value of the analog discharge waveform to a threshold, and outputting a '1' when the value of the analog discharge waveform bears a first relationship to the threshold and outputting a '0' when the value of the analog discharge waveform bears a second relationship to the threshold.

16. The method of claim 15, comprising determining, from the single-ended signal representative of the pulse-width-modulated signal, a duration of an interval during which the analog charge storage circuitry discharges.

17. The method of claim 14, wherein:
deriving control signals from the intermediate digital signal comprises deriving a pair of differential signals representative of the pulse-width-modulated signal;
the charging and discharging comprises controlling respective separate charge storage elements, including controlling discharge of each of the separate charge storage elements according to a respective signal in the pair of differential signals; and comparing the analog discharge waveform to another signal comprises comparing a value of a first respective separate discharge waveform to a value of a second respective separate discharge waveform, and outputting a '1' when the value of the first respective separate discharge waveform bears a first relationship to the value of the second respective separate discharge waveform, and outputting a '0' when the value of the first respective separate discharge waveform bears a second relationship to the value of the second respective separate discharge waveform.

18. The method of claim 12, wherein:
deriving a digital output signal from the analog discharge waveform output by the analog charge storage circuitry comprises:
deriving the digital output signal on a falling clock edge; and
maintaining the digital output signal derived on the falling clock edge until a subsequent falling clock edge.

19. The method of claim 12, further comprising calibrating the analog charge storage circuitry to a data rate of the pulse-width-modulated signal.

20. The method of claim 19, wherein the calibrating comprises:
for each data range to be calibrated:
generating a calibration pattern representing a first binary input value;
varying at least one of a capacitance and a current-limiting element to provide different combinations of the capacitance and the current-limiting element to vary a time constant of the analog charge storage circuitry while the calibration pattern represents the first binary input value, and for each respective one of the different combinations:
while the calibration pattern represents the first binary input value, for each respective combination of the capacitance and the current-limiting element:
varying a reference voltage for a first differential input and recording a respective first reference value when the digital output signal changes from a first binary output value to a second binary output value,
varying a reference voltage for a second differential input and recording a respective second reference value when the digital output signal changes from the second binary output value to the first binary output value, and
recording a respective first difference between the respective first reference value and the respective second reference value for the respective one of the different combinations;
recording a maximum one of the respective first difference between the respective first reference value and the respective second reference value over all of the different combinations;
generating a calibration pattern representing a second binary input value;
varying at least one of a capacitance and a current-limiting element to provide different combinations of the capacitance and the current-limiting element to vary a time constant of the analog charge storage circuitry while the calibration pattern represents the second binary input value, and for each respective one of the different combinations:
while the calibration pattern represents the second binary input value, for each respective combination of the capacitance and the current-limiting element:
varying a reference voltage for a first differential input and recording a respective first reference value when the digital output signal changes from a first binary output value to a second binary output value,
varying a reference voltage for a second differential input and recording a respective second reference value when the digital output signal changes from the second binary output value to the first binary output value, and
recording a respective second difference between the respective first reference value and the respective second reference value for the respective one of the different combinations; and
recording a maximum one of the respective second difference between the respective first reference value and the respective second reference value over all of the different combinations; and
setting the combination of the capacitance and the current-limiting element for the data range being calibrated to an average of the capacitance and the current-limiting element corresponding to the maximum one of the respective first difference and the maximum one of the respective second difference.

21. The method of claim 20, wherein varying at least one of the capacitance and the current-limiting element comprises varying the capacitance.

22. The method of claim 20, wherein varying at least one of the capacitance and the current-limiting element comprises varying a variable resistance.

23. The method of claim 20, wherein varying at least one of the capacitance and the current-limiting element comprises varying a variable capacitance and a variable resistance.

* * * * *